(12) United States Patent
Oshima et al.

(10) Patent No.: US 12,099,662 B2
(45) Date of Patent: Sep. 24, 2024

(54) INPUT DEVICE

(71) Applicant: TDK CORPORATION, Tokyo (JP)

(72) Inventors: Kazunori Oshima, Tokyo (JP);
Masayuki Sugasawa, Tokyo (JP);
Tatsuya Hayashi, Tokyo (JP); Kouichi Sakita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/103,197

(22) Filed: Jan. 30, 2023

(65) Prior Publication Data

US 2023/0305640 A1 Sep. 28, 2023

(30) Foreign Application Priority Data

Mar. 28, 2022 (JP) ................................ 2022-051439

(51) Int. Cl.
| | |
|---|---|
| *G06F 3/02* | (2006.01) |
| *G06F 3/023* | (2006.01) |
| *G06F 3/0338* | (2013.01) |
| *G06F 3/0354* | (2013.01) |
| *G06F 3/038* | (2013.01) |
| *H03K 17/97* | (2006.01) |

(52) U.S. Cl.
CPC ................ *G06F 3/02* (2013.01); *G06F 3/023* (2013.01); *G06F 3/0233* (2013.01); *G06F 3/0338* (2013.01); *G06F 3/0354* (2013.01); *G06F 3/038* (2013.01); *H03K 2017/9713* (2013.01)

(58) Field of Classification Search
CPC .......... G06F 3/02; G06F 3/023; G06F 3/0233; G06F 3/0338; G06F 3/038; G06F 3/0354; H03K 2017/9713
See application file for complete search history.

(56) References Cited

U.S. PATENT DOCUMENTS

2014/0237366 A1* 8/2014 Poulos .................... G06F 3/013
715/728
2015/0084900 A1* 3/2015 Hodges ............... A63F 13/2145
345/173

FOREIGN PATENT DOCUMENTS

JP 2018-005452 A 1/2018

* cited by examiner

*Primary Examiner* — Adam R. Giesy
(74) *Attorney, Agent, or Firm* — Oliff PLC

(57) ABSTRACT

Provided is an input device capable of facilitating an operation for inputting, a command such as characters. The input device includes an operation unit of which an operation amount is variable and a control unit. The control unit selects one command group among a plurality of command groups and decides on a command on the basis of the command group selected and the operation amount of the operation unit. The control unit switches the command group selected when the operation amount of the operation unit is in a prescribed range.

9 Claims, 12 Drawing Sheets

FIG. 7

| | XG = 0 | | | | | | |
|---|---|---|---|---|---|---|---|
| X \ Y | 1 | 2 | 3 | 4 | 5 | 6 | 7 |
| 1 | I'M DEAF. | THANK YOU | PLEASE GIVE ME THIS. | THE SIZE IS S. | CAN I HAVE CHOPSTICKS, PLEASE? | UP TO OO STATION | HELLO |
| 2 | I'M HARD OF HEARING. | WHAT'S GOING ON? | I NEED A PLASTIC BAG. | THE SIZE IS R. | PLEASE GIVE ME A WET TOWEL. | UP TO △△ STATION | LONG TIME NO SEE |
| 3 | I'M DEAF! I CAN'T HEAR! | WHO ARE YOU? | I DON'T HAVE A POINT CARD. | THE SIZE IS M. | PLEASE WARM IT UP. | PLEASE GIVE ME A TICKET. | HOW ARE YOU? |
| 4 | I CAN'T HEAR YOU. PLEASE CALL ME INSTEAD. | I'M SORRY. | I HAVE AN ECO-BAG. | THE SIZE IS L. | I'M HERE TO PICK UP A PACKAGE! | DISABLED DISCOUNT PLEASE. | FINE WEATHER |
| 5 | I CAN'T HEAR YOU. CAN I COMMUNICATE WITH YOU IN WRITING? | COULD YOU SHOW ME AROUND? | I'M SORRY I DON'T HAVE SMALL CHANGE. | THE SIZE IS GIGA. | PLEASE GIVE ME A PREPAYMENT SLIP. | I'D LIKE TO GO TO THE STATION. | IT'S RAINING, ISN'T IT? |
| 6 | COULD YOU SPEAK SLOWLY? | I'D LIKE TO CONSULT WITH YOU. | COFFEE, PLEASE. | HOT | PLEASE GIVE ME A CASH-ON-DELIVERY SLIP. | I'D LIKE TO GO TO OO SHOP. | IT'S COLD |
| 7 | GIVE ME A PEN AND PAPER. | PLEASE PARK YOUR CAR IN THE DISABLED PARKING LOT. | CAFE AU LAIT, PLEASE. | ICE | I'D LIKE A ROUND-TRIP DELIVERY SERVICE, PLEASE. | PLEASE STOP BY THE CONVENIENCE STORE ON THE WAY. | IT'S HOT |

FIG. 8

| Y \ X | \multicolumn{7}{c}{XG = 1} |
| | 1(8) | 2(9) | 3(10) | 4(11) | 5(12) | 6(13) | 7(14) |
|---|---|---|---|---|---|---|---|
| 1 | あ | か | さ | た | な | は | ま |
| 2 | い | き | し | ち | に | ひ | み |
| 3 | う | く | す | つ | ぬ | ふ | む |
| 4 | え | け | せ | て | ね | へ | め |
| 5 | お | こ | そ | と | の | ほ | も |
| 6 |  |  |  |  |  |  |  |
| 7 |  |  |  |  |  |  |  |

FIG. 9

| Y\X | \ | 1(15) | 2(16) | 3(17) | 4(18) | 5(19) | 6(20) | 7(21) |
|---|---|---|---|---|---|---|---|---|
|  |  | \multicolumn{7}{c}{XG = 2} |
| 1 |  | や | ら | わ | A | H | O | V |
| 2 |  | ゆ | り | を | B | I | P | W |
| 3 |  | よ | る | ん | C | J | Q | X |
| 4 |  |  | れ |  | D | K | R | Y |
| 5 |  |  | ろ |  | E | L | S | Z |
| 6 |  |  |  |  | F | M | T |  |
| 7 |  |  |  |  | G | N | U |  |

FIG. 10

| | A/D CONVERSION OUTPUT VALUE [dec] | | X VALUE | | |
|---|---|---|---|---|---|
| | RANGE | ALLOCATION | | | |
| FIRST RANGE | 0 ~ 5 | np | | XG-- | XG-- |
| | 6 ~ 40 | 1 | 1 | 8 | 15 |
| | 41 ~ 75 | 2 | 2 | 9 | 16 |
| | 76 ~ 110 | 3 | 3 | 10 | 17 |
| THIRD RANGE | 111 ~ 145 | 4 | 4 | 11 | 18 |
| | 146 ~ 180 | 5 | 5 | 12 | 19 |
| | 181 ~ 215 | 6 | 6 | 13 | 20 |
| | 216 ~ 250 | 7 | 7 | 14 | 21 |
| SECOND RANGE | 250 ~ 255 | p | XG++ | XG++ | XG++ |

| | A/D CONVERSION OUTPUT VALUE [dec] | | X VALUE | | |
|---|---|---|---|---|---|
| | RANGE | ALLOCATION | | | |
| FIRST RANGE | 0 ~ 5 | np | | XG-- | XG-- |
| | 6 ~ 40 | 1 | 1 | 8 | 15 |
| | 41 ~ 75 | 2 | 2 | 9 | 16 |
| | 76 ~ 110 | 3 | 3 | 10 | 17 |
| THIRD RANGE | 111 ~ 145 | 4 | 4 | 11 | 18 |
| | 146 ~ 180 | 5 | 5 | 12 | 19 |
| | 181 ~ 215 | 6 | 6 | 13 | 20 |
| | 216 ~ 250 | 7 | 7 | 14 | 21 |
| SECOND RANGE | 250 ~ 255 | p | XG++ | XG++ | XG++ |

| | A/D CONVERSION OUTPUT VALUE [dec] | | X VALUE | | |
|---|---|---|---|---|---|
| | RANGE | ALLOCATION | | | |
| FIRST RANGE | 0 ~ 5 | | | | |
| | 6 ~ 40 | 1 | 1 | 14 | 15 |
| | 41 ~ 75 | 2 | 2 | 13 | 16 |
| | 76 ~ 110 | 3 | 3 | 12 | 17 |
| THIRD RANGE | 111 ~ 145 | 4 | 4 | 11 | 18 |
| | 146 ~ 180 | 5 | 5 | 10 | 19 |
| | 181 ~ 215 | 6 | 6 | 9 | 20 |
| | 216 ~ 250 | 7 | 7 | 8 | 21 |
| SECOND RANGE | 250 ~ 255 | p/np | XG++(Y=np) XG--(Y=p) | XG++(Y=np) XG--(Y=p) | XG++(Y=np) XG--(Y=p) |
| | | | XG=0 | XG=1 | XG=2 |

INPUT DEVICE

CROSS-REFERENCE TO RELATED APPLICATION

Priority is claimed on Japanese Patent Application No. 2022-051439, filed Mar. 28, 2022, the content of which is incorporated herein by reference.

BACKGROUND OF THE INVENTION

Field of the Invention

The present disclosure relates to an input device.

Description of Related Art

An input device through which an operation is performed by a human hand is known.

An optical input device described in Patent Document 1 includes a spherical housing capable of being gripped by one hand; an operating element disposed at a position corresponding to a finger of the hand gripping the housing; a plurality of switches disposed at positions corresponding to other fingers; and a decision unit configured to decide on input characters on the basis of operation states of the plurality of switches and an operation position of the operating, element. In the optical input device, a character group is identified on the basis of a combination of operation states of the plurality of switches and a character included in the character group is identified on the basis of the operation position of the operating element (see Patent Document 1).

PATENT DOCUMENTS

[Patent Document 1] Japanese Unexamined Patent Application, First Publication No. 2018-5452

SUMMARY OF THE INVENTION

However, a character input operation may be complicated in the related art.

The present disclosure has been made in consideration of such circumstances and an objective thereof is to provide an input device capable of facilitating, an operation for inputting commands such as characters.

According to an aspect of the present disclosure, there, is provided an input device including: an operation unit of which an operation amount is variable; and a control unit, wherein the control unit is configured to select one command group among a plurality of command groups and decides on a command on a basis of the command group selected and the operation amount of the operation unit, and wherein the control unit switches the command group selected when the operation amount of the operation unit is in a prescribed range.

The input device according to the present disclosure can facilitate an operation for inputting commands such as characters.

BRIEF DESCRIPTION OF THE DRAWINGS

FIG. 7 is a diagram showing an example of a command table of the input device according to the embodiment.

FIG. 8 is a diagram showing another example of the command table of the input device according to the embodiment.

FIG. 9 is a diagram showing another example of the command table of the input device according to the embodiment.

FIG. 10 is a diagram showing an example of an increment in the command table of the input device according to the embodiment.

FIG. 11 is a diagram showing an example of a decrement in the command table of the input device according to the embodiment.

FIG. 14 is a diagram showing another example of the increment and decrement in the command table of the input device according to the embodiment.

DETAILED DESCRIPTION OF THE INVENTION

Hereinafter, embodiments of the present disclosure will be described with reference to the drawings.

[Input Device]

Figure 1:
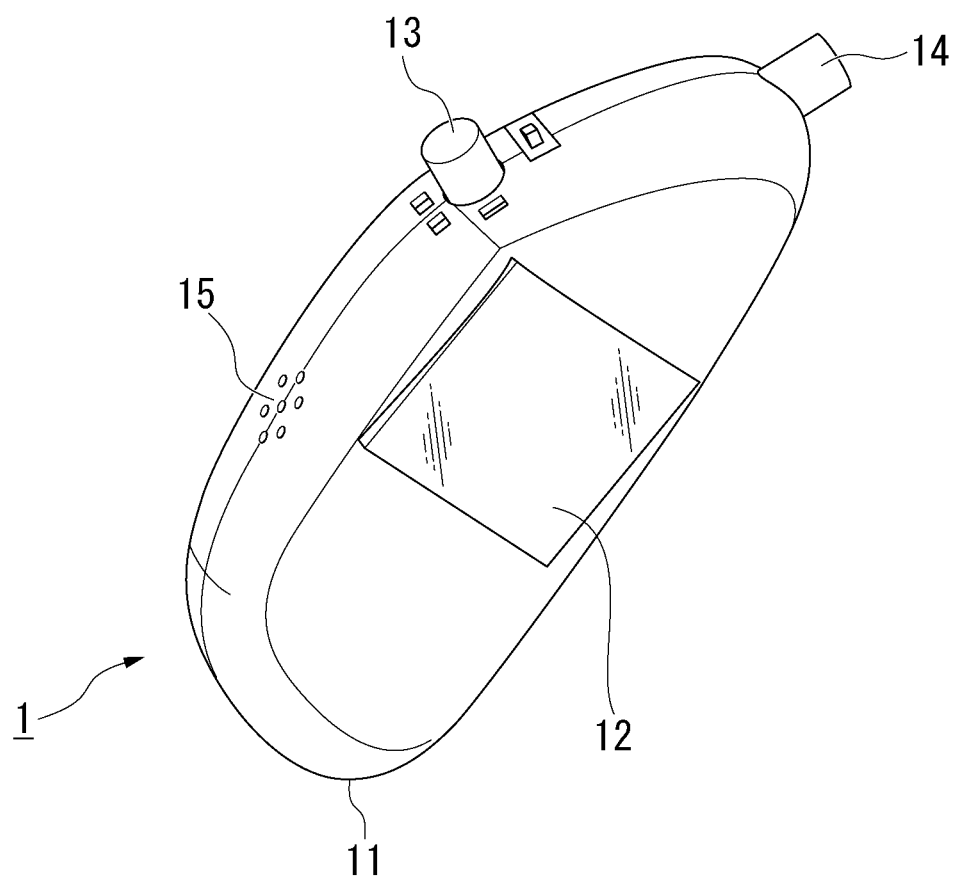
FIG. 1 is a diagram showing an example of the schematic appearance of an input device according to an embodiment.

FIG. 1 is a diagram showing an example of the schematic appearance of an input device 1 according to the embodiment.

The input device 1 includes a housing 11, a screen 12, a lever portion 13, a lever portion 14, and a speaker 15.

The housing 11 has, for example, a similar shape to a mouse used to operate a computer (e.g., a round shape similar to an ellipse). Also, the shape of the housing 11 may be another shape.

The screen 12 is provided on, one side of the housing 11 and has a function of displaying and outputting information.

The lever portion 13 is provided at a prescribed position of the housing 11 and can be pushed by a human finger.

The lever portion 14 is provided at another prescribed position of the housing 11 and can be pushed by a human finger.

The speaker 15 is an utterance speaker and has a sound output function.

Here, in the present embodiment, each of the lever portion 13 and the lever portion 14 has a built-in magnetic sensor and a value corresponding to a pushing amount is detected by the magnetic sensor.

The lever portion 13 and the lever portion 14 are disposed at a plurality of different operation positions.

Also, the input device 1 may have an input operation unit other than the lever portion 13 and the lever portion 14. The operation unit may include, for example, a button (not shown).

In the present embodiment, the input device 1 may identify one command on the basis of an, operation on the lever portion 13 and an operation on the lever portion 14. In this state, the input device 1 may perform a process based on the command by confirming the reception of the command in accordance with a state in which another prescribed operation unit (for example, a button) is pushed.

In the present embodiment, the screen 12 is provided on a surface opposite to the surface in contact with (or in close proximity to) the palm of a person when the input device 1 has been gripped by a human hand.

In the input device 1, a vibrating element having a vibration generation function is provided inside of the surface in contact with (or in close proximity to) the palm of the person.

Figure 2:
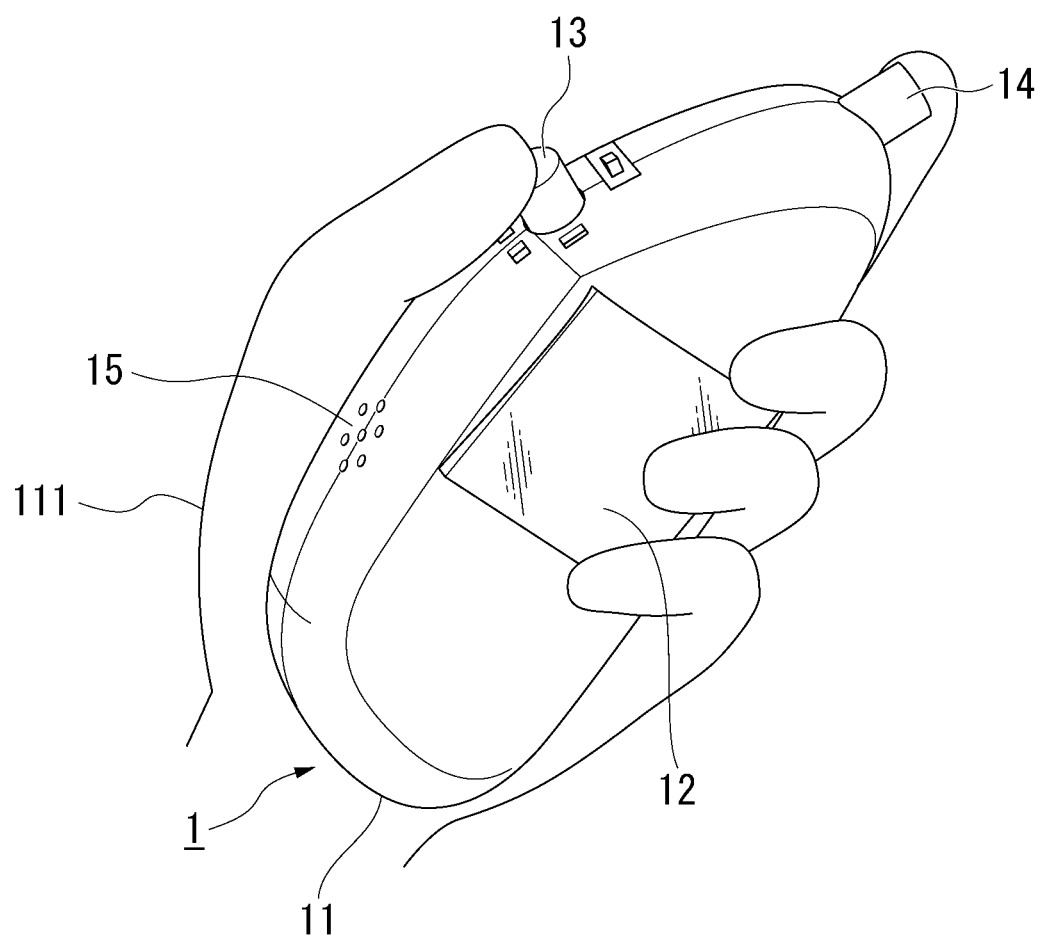
FIG. 2 is a diagram showing an example of a method of gripping the input device according to the embodiment.

FIG. 2 is a diagram showing an example of a method of gripping the input device 1 according to the embodiment.

The user (the person) can grip the input device 1 with one hand 111 and can perform operations on the lever portion 13 and the lever portion 14 with the one hand 111 while gripping the input device 1.

In the example of FIG. 2, the input device 1 is gripped by the user's left hand, the lever portion 13 is operated by the user's thumb, and the lever portion 14 is operated by the user's index finger.

Figure 3:
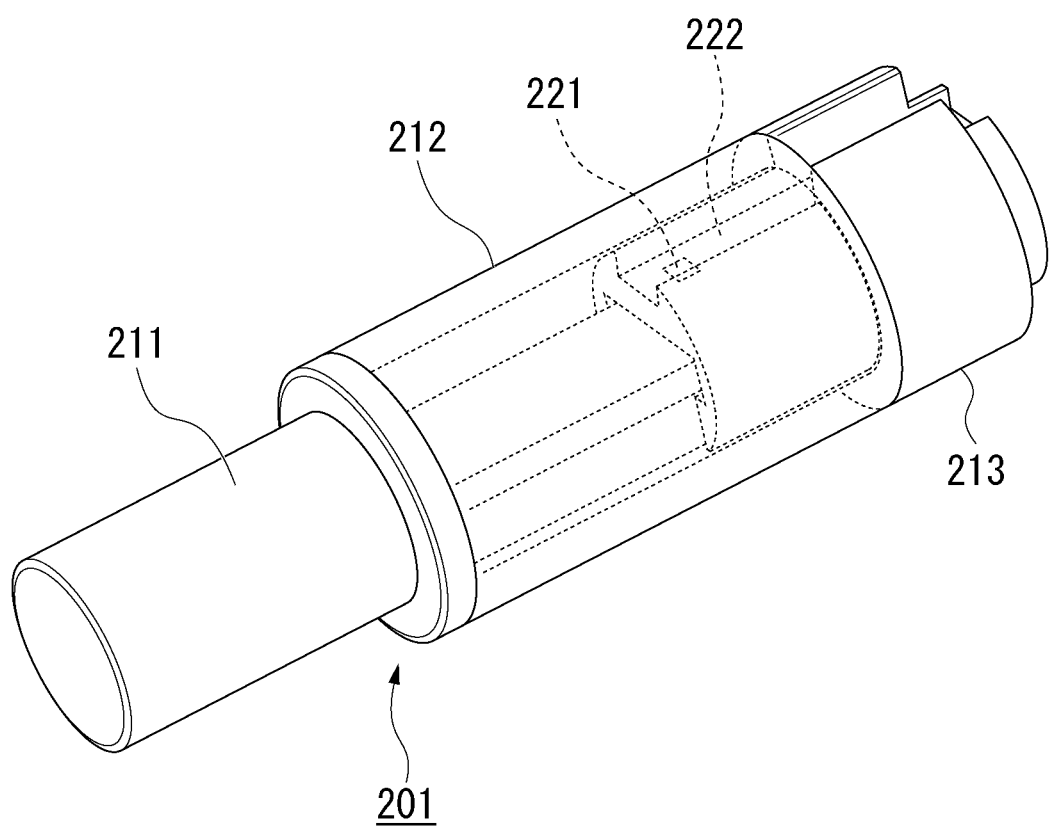
FIG. 3 is a diagram showing an example of a schematic configuration of a lever portion of the input device according to the embodiment.

FIG. 3 is a diagram showing an example of a schematic configuration of the lever portion 201 of the input device 1 according to the embodiment.

The example of the configuration of the lever portion 201 shown in FIG. 3 is an example of the configuration for collectively describing the example of the configuration of the lever portion 13 and the example of the configuration of the lever portion 14 shown in FIG. 1.

That is, in the present embodiment, the configuration of the lever portion 201 is applied, for example, to one or both of the lever portion 13 and the lever portion 14.

The lever portion 201 includes an operation lever 211, which is a lever pushed by the user's finger, a plastic spring portion 212, and a housing 213.

Also, the lever portion 201 includes a magnetic sensor attachment portion 221 that is a portion to which a magnetic sensor is attached inside of the housing 213 and a magnetic sensor substrate attachment slit 222 that is a portion to which a substrate of the magnetic sensor is attached.

The operation lever 211 can be moved in a direction of, one axis. As a movement mechanism of the operation lever 211, for example, a piston mechanism may be used.

The plastic spring portion 212 can be compressed in accordance with a state in which the operation lever 211 is pushed.

A portion for receiving the plastic spring portion 212 that has been compressed is provided at the opposite side of the operation lever 211 with respect to the plastic spring portion 212.

Thereby, the operation lever 211 can be pushed by the force of the user's finger, and returns to its original state under an elastic force (a repulsive force) of the plastic spring portion 212 when a pushing force is weakened.

Figure 4A:
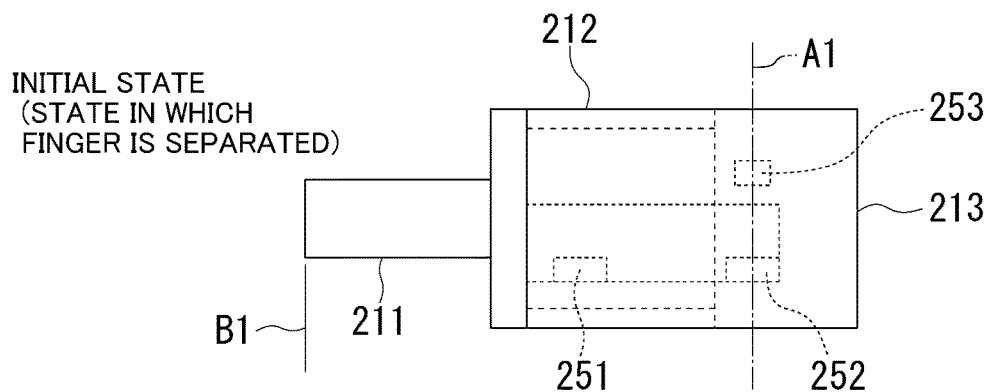
FIGS. 4A and 4B are diagrams showing, an example in which an operation lever of the input device according to the embodiment is pressed.
Figure 4B:
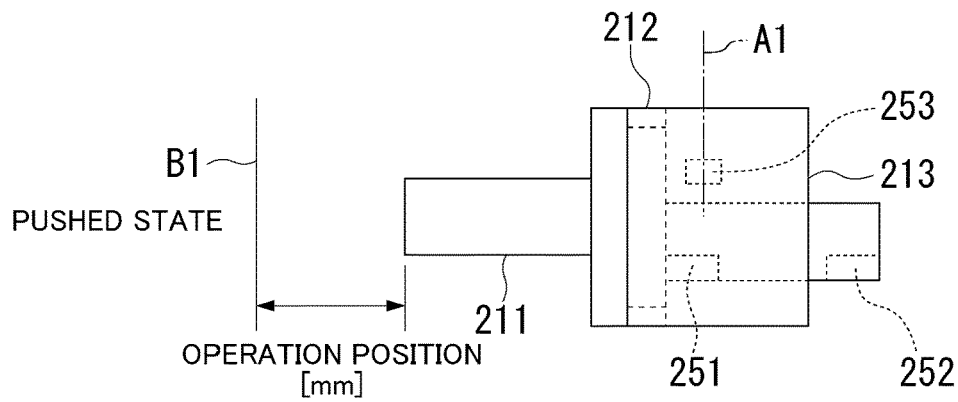

FIGS. 4A and 4B are diagrams showing examples in which the operation lever 211 of the input device 1 according to the embodiment is pressed.

FIGS. 4A and 4B show examples of schematic configurations of the lever portion 201. Parts of FIGS. 4A and 4B are perspective views.

Specifically, the operation lever 211, the plastic spring portion 212, the housing 213, a magnet 251, a magnet 252, and a magnetic sensor 253 are shown. The magnet 251 the magnet 252, and the magnetic sensor 253 are disposed inside of the lever portion 201.

Here, the magnetic sensor 253 is provided at a fixed position of the lever portion 201 regardless of a pushing amount of the operation lever 211. On the other hand, the magnet 251 and the magnet 252 are provided at positions that move in accordance with the pushing amount of the operation lever 211.

Thereby, a value detected by the magnetic sensor 253 changes in accordance with the pushing amount of the operation lever 211.

In FIG. 4A, a state in which the user's finger is separated from the operation lever 211 is shown. That is, the state is an initial state in which no pushing force is applied to the operation lever 211.

In FIG. 4B, a state in which the operation lever 211 is pushed by the user's finger is shown. In this state, the operation lever 211 is pushed by an amount of the operation position [mm] from the initial state (initial state line B1).

Also, in FIGS. 4A and 4B, a center line A1 of the magnetic sensor 253 is shown. The center line A1 is a line in a direction perpendicular to a pushing direction of the operation lever 211.

In the present embodiment an analog value detected by the magnetic sensor 253 changes with a change in the operation position. Subsequently, the analog value is converted into a digital value by an analog-to-digital (A/D) converter and the digital value, is output.

When the operation lever 211 is pushed by the user's finger and the operation position increases from 0, the A/D conversion output value increases from 0.

Figure 5:
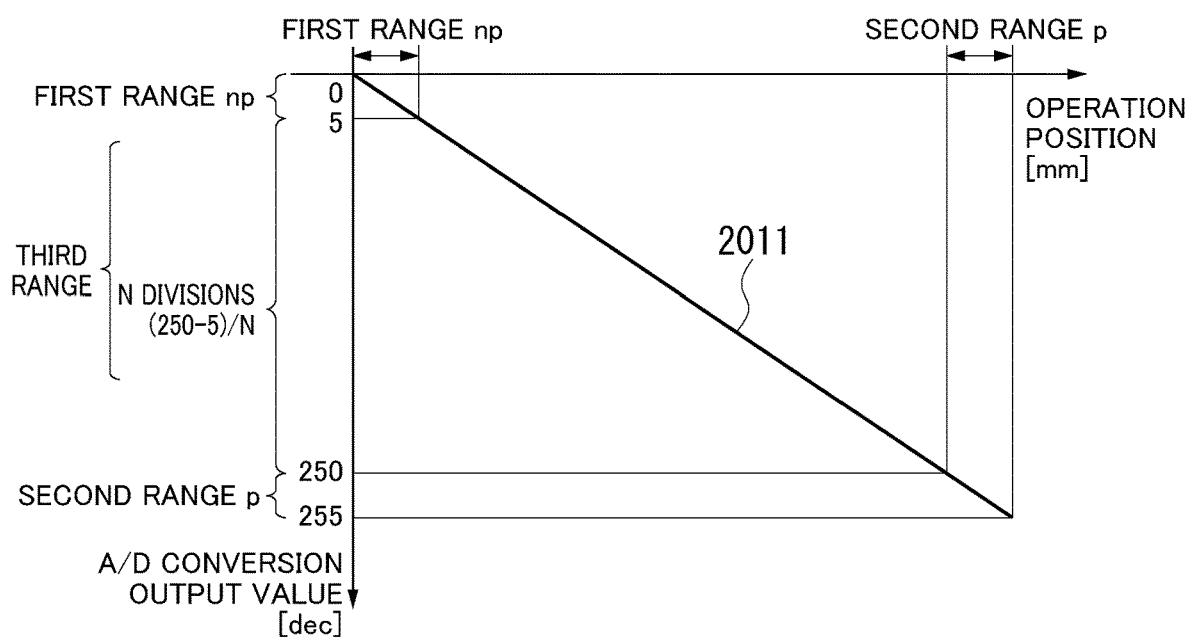
FIG. 5 is a diagram showing an example of an analog-to-digital (A/D) conversion output value corresponding to a pushing amount of the operation lever of the input device according to the embodiment.

FIG. 5 is a diagram showing an example of an A/D conversion output value corresponding to the pushing amount of the operation lever 211 of the input device 1 according to the embodiment.

In the graph shown in FIG. 5, the horizontal axis represents an operation position [mm] and the vertical axis represents an A/D) conversion output value [dec].

In FIG. 5, a special characteristic 2011 of a relationship between the operation position [mm] and the A/D conversion output value [dec] is shown.

Also, as the unit of the operation position and the unit of the A/D conversion output value, any unit may be used.

In the present embodiment, when the pushing amount (operation position) of the operation lever 211 changes, a magnetic flux density received by the magnetic sensor 253 changes almost linearly.

Thereby, the special characteristic 2011 becomes a substantially linear special characteristic.

Here, in the present embodiment, the A/D conversion output value becomes a value greater than or equal to 0 and less than or equal to 255.

In the example of FIG. 5, a range where the A/D conversion output value is greater than or equal to 0 and less than or equal to 5 is set as a first range.

In the example of FIG. 5, a range where the A/D conversion output value is greater than or equal to 250 and, less than or equal to 255 is set as a second range.

A third range located between the first range and the second range is divided into N (N is an integer greater than or equal to 2).

In the example of FIG. 5, the third range is a range where the A/D conversion output value is greater than 5 and less than 250.

When the third range is divided into N, the width of one division range (sub-range) corresponds to {(255−5)−5}/N.

Here, a case where the piston-shaped operation lever 211 capable of sliding along one axis is used is shown in the present embodiment, but the configuration of the operation lever is not limited thereto.

For example, an operation lever capable of rotating with respect to a prescribed axis may be used. In this case, an operation amount (an operation position) may be identified in accordance with a rotation amount (for example, an angle of rotation) of the operation lever. For example, this operation lever may be configured to be rotatable by one finger of the user.

Figure 6:
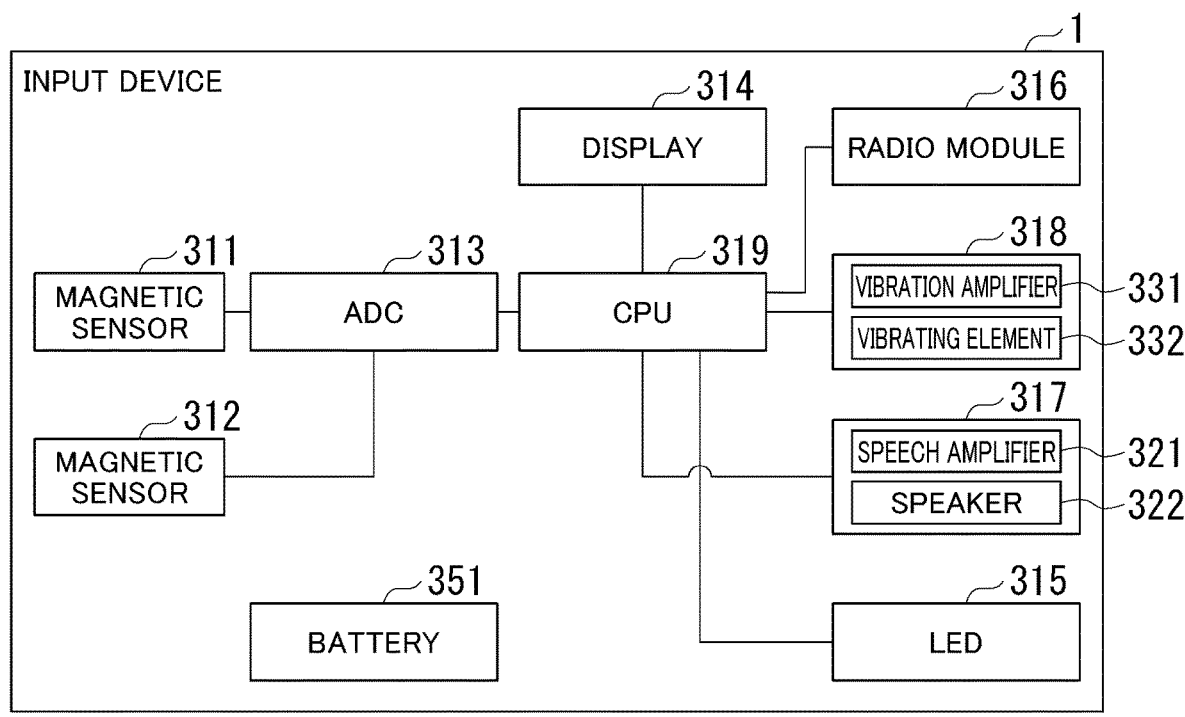
FIG. 6 is a diagram showing an example of schematic functional blocks of the input device according to the embodiment.

FIG. 6 is a diagram illustrating an example of a schematic functional block of the input device 1 according to the embodiment.

The input device 1 includes a magnetic sensor 311, a magnetic sensor 312, an A/D converter 313, a display 314, a light-emitting diode (LED) 315, a radio module 316, a sound output unit 317, a vibration unit 318, a central processing unit (CPU) 319, and a battery 351.

The magnetic sensor 311 is a magnetic sensor of the first lever portion (the lever portion 13 in the example of FIG. 1). The magnetic sensor 311 outputs a detected value (an analog value) corresponding to the pushing amount of the operation lever of the first lever portion (the operation lever 211 in the examples of FIGS. 3, 4A and 4B) to the A/D converter 313.

The magnetic sensor 312 is a magnetic sensor of a second lever portion (the lever portion 14 in the example of FIG. 1). The magnetic sensor 312 outputs a detected value (an analog value) corresponding to the pushing amount of the operation lever of the second lever portion (the operation lever 211 in the examples of FIGS. 3, 4A and 4B) to the A/D converter 313.

Here, the case where the input device 1 includes two lever portions is shown in the present embodiment, but the input device 1 may include three or more lever portions. In this case, the input device 1 includes three or more magnetic sensors equal in number to the lever portions.

The A/D converter 313 inputs a detected value (an analog value) output from each of the magnetic sensors 311 and 312, converts the detected value from the analog value, into a digital value, and outputs the digital value (an A/D conversion output value) to the CPU 319.

Here, a case where a common A/D converter 313 is also used for a plurality of magnetic sensors 311 and 312 is shown in the present embodiment, but a separate A/D converter may be provided for each of the plurality of magnetic sensors 311 and 312 as another example of the configuration.

The display 314 has a screen (the screen 12 in the example of FIG. 1) that displays and outputs information.

The LED 315 (not shown in the example of FIG. 1) is turned on or off or blinks. Also, the number and arrangement of LEDs 315 may be arbitrary.

The radio module 316 has a function of performing wireless communication with an external device. The external device may be, for example, a computer or a smartphone.

The sound output unit 317 outputs a sound. The sound output unit 317 includes a speech amplifier 321 that amplifies a sound signal and a speaker 322 that outputs the amplified sound signal (the speaker 15 in the example of FIG. 1).

Here, the case where the input device 1 includes the radio module 316 has been described in the present embodiment, but the input device 1 may have a function of performing wired communication with an external device together with or instead of the radio module 316 as another example of the configuration.

For example, when the input device 1 communicates with the external device, the program or other data stored in the input device 1 may be changed by the external device.

The vibration unit 318 performs a vibration operation. The vibration unit 318 includes a vibration amplifier 331 that amplifies a vibration signal and a vibrating element 332 that vibrates with the amplified vibration signal (not shown in the example of FIG. 1). Also, the number and arrangement of vibration units 318 may be arbitrary.

For example, the vibrating element 332 may be embedded in the vicinity of each lever portion for each lever portion (the lever portions 13 and 14 in the example of FIG. 1) inside of the input device 1.

Also, for example, a piezoelectric element, a vibration, motor, or the like may be used as the vibrating element 332.

The CPU 319 performs various types of processes and control.

Also, the CPU 319 includes a storage unit (not shown) and various types of information can be stored in the storage unit.

The CPU 319 performs various types of processes and control by, for example, reading and executing the program stored in the storage unit.

In the present embodiment, the CPU 319 inputs a digital value (an A/D conversion output value) corresponding to the detected value of each of the magnetic sensors 311 and 312 from the A/D converter 313 and performs a process based on the digital value.

In the present embodiment, for example, a plurality of lever portions (the lever portion 13 and the lever portion 14 in the example of FIG. 1) are independent and can be operated simultaneously. Also, the A/D converter 313 and the CPU 319 can distinguish and process digital values (A/D conversion output values) for the lever portions when the plurality of lever portions are operated simultaneously.

Also, the CPU 319 outputs display information to the display 314, such that the information is displayed on and output to the screen of the display 314.

Also, the CPU 319 turns on, blinks, or turns off the LED 315 by outputting a control signal to the LED 315.

Also, the CPU 319 can perform wireless communication using the radio module 316.

Also, the CPU 319 outputs a sound from the speaker 322 by outputting a sound signal to the sound output unit 317.

Also, the CPU 319 vibrates the vibrating element 332 by outputting a vibration signal to the vibration unit 318.

The battery 351 supplies power to each part of the input device 1.

As the battery 351, for example, a primary battery may be used, or a secondary battery may be used.

Also, when the input device 1 has a function of receiving the supply of external power, externally supplied power may be used together with the battery 351 or instead of the battery 351.

Also, the input device 1 may include a microphone for inputting a sound. In this case, a sound signal collected by the microphone is input to the CPU 319.

Also, the CPU 319 performs a process based on the input sound signal. The process may be, for example, a process of recognizing the input sound (here, a voice) and displaying and outputting content of the recognized voice as text information on the screen of the display 314. In this case, the input device 1 can display content of speech of a healthy person as text so that the content can be visually recognized, for example, when the user is deaf.

Here, for example, a configuration in which a device different from the input device 1 (for example, a server device or the like) has a voice recognition function, the CPU 319 transmits a sound signal to the device, and the input device 1 receives information of a result obtained by the device having performed a voice recognition process for the sound signal from the device and uses the received information may be used.

As the microphone, for example, a micro electro mechanical systems (MEMS) microphone may be used.

<Other Examples of Location Detection>

Although an example of a configuration in which a pushing amount (an operation position) of the operation lever (the operation lever 211 in the example of FIGS. 4A and 4B) is detected using a magnetic sensor (the magnetic sensor 253 in the example of FIGS. 4A and 4B) has been described in the present embodiment, other methods may be used as a method of detecting the pushing amount of the operation lever.

For example, as the method of detecting the pushing amount of the operation lever, a method of outputting a value corresponding to the pushing amount (the operation position) of the operation lever using a transmissive optical rotary encoder, a reflective rotary encoder, a transmissive optical linear encoder, a magnetic rotary encoder, or a magnetic linear encoder may be used.

In this method of detecting the pushing amount of the operation lever, for example, an output element is disposed on one of the operation lever configured to perform relative movement and a fixed portion (for example, a housing), an input element is disposed on the other, and the output from the output element is input by the input element, such that the pushing amount of the operation lever is detected.

When the lever portion 13 and the lever portion 14 shown in FIG. 1 are described together in the present embodiment, the names and reference signs of the components shown in FIGS. 3 to 6 may be used.

In the present embodiment, the physical configurations of the lever portion 13 and the lever portion 14 shown in FIG. 1 are similar to each other.

Also, as another example of the configuration, the physical configurations of the plurality of lever portions may be different from each other.

<Example of Command Table of Characters, Etc.>

FIG. 7 is a diagram showing an example of a command table of the input device 1 according to the embodiment.

FIG. 8 is a diagram showing another example of the command table of the input device 1 according to the embodiment.

FIG. 9 is a diagram showing another example of the command table of the input device 1 according to the embodiment.

Here, in the present embodiment, XG represents information for identifying a command group and an integer is used as the information.

In FIG. 7, a command table of XG=0 is shown.

In FIG. 8, a command table of XG=1 is shown.

In FIG. 9, a command table of XG=2 is shown.

These command tables are stored in a storage unit inside of the input device 1.

Also, as another example of the configuration, these command tables may be stored in a database outside of the input device 1 or the like. In this case, information about content of these command tables is provided to the input device 1.

Also, these command tables are, for example, pre-set, but may be updatable at any timing.

Also, in the present embodiment, X denotes a value identified on the basis of a digital value (an A/D conversion output value) corresponding to a pushing amount of the operation lever of one prescribed lever portion (the lever portion 13 in the present embodiment).

Y denotes a value identified on the basis of a digital value (an A/D conversion output value) corresponding to a pushing amount of the operation lever of another prescribed lever portion (the lever portion 14 in the present embodiment).

The command table of XG=0 shown in FIG. 7 will be described.

In the command table, the horizontal axis represents an X value (1 to 7 in the present example) and the vertical axis represents a Y value (1 to 7 in the present example).

In the command table, if the X value and the Y value are uniquely determined, one command is identified. For example, when X=2 and Y=1, the command "Thank you" is identified. For example, when X=5 and Y=5, the command "Please give me a prepayment slip" is identified.

In the command table of XG=0, commands related to dialogue text (a string including a plurality of characters) are stored.

The command table of XG=1 shown in FIG. 8 will be described.

In the command table, the horizontal axis represents an X value (1(8) to 7(14) in the present example) and the vertical axis represents a Y value (1 to 7 in the present example).

Here, for convenience of description, (8) to (14) are added to the X values, of 1 to 7 and are used to distinguish from other XG command tables.

In the command table of XG=1, one command is identified when the X value and Y value are uniquely determined. For example, when X=2 and Y=1, a command corresponding to a Japanese character (pronounced "ka") indicated in the cell identified by X=2 and Y=1 in the command table of XG=1 is identified. For example, when X=5 and Y=5, a command corresponding to another Japanese character (pronounced "no") indicated in the cell identified by X=5 and Y=5 in the command table of XG=1 is identified.

In the example of FIG. 8, in the command table of XG=1, commands corresponding to Japanese characters are allocated to cells of X=1 to 7 and Y=1 to 5. Although no command is allocated to Y=6 to 7 in the command table, this is an example and the present disclosure is not limited thereto.

Commands related to, characters are stored in the command table of XG=1.

The command table of XG=2 shown in FIG. 9 will be described.

In the command table, the horizontal axis represents an X value (1(15) to 7(21) in the present example) and the vertical axis represents a Y value (1 to 7 in the present example).

Here, for convenience of description, (15) to (21) are added to the X values of 1 to 7 and are used to distinguish from other XG command tables.

In the command table of XG=2, a command is identified when the X value and Y value are uniquely determined. For example, when X=2 and Y=1, a command corresponding to a Japanese character (pronounced "ra") indicated in the cell identified by X=2 and Y=1 in the command table of XG=2 is identified. For example, when X=5 and Y=5, the command "L" is identified.

In the example of FIG. 9, in the command table of XG=2, commands corresponding to Japanese characters are allocated to cells of X=1 and Y=1 to 3, cells of X=2 and Y=1 to 5, and cells of X=3 and Y=1 to 3.

Also, in the example of FIG. 9, in the command table of XG=2, commands corresponding to English characters are allocated to cells of X=4 to 6 and Y=1 to 7 and cells of X=7 and Y=1 to 5.

Although no command is allocated to some of X and Y combinations in the command table, this is an example and the present disclosure is not limited thereto.

In the command table of XG=2, commands related to characters are stored.

Here, for example, the XG value is stored in the storage unit inside of the input device 1.

Also, in the input device 1, the XG value is switched in accordance with a prescribed operation. The prescribed operation may be, for example, an operation on the lever portion 13 or the lever portion 14, or may be an operation on an operation unit different from the lever portion 13 and the lever portion 14 as another example.

The CPU 319 identifies one command table on the basis of the XG value stored in the storage unit and uses the content of the identified command table.

Also, the CPU 319 acquires X values and Y values on the basis of digital values (A/D conversion output values) input from the A/D converter 313, identifies commands in the command table on the basis of these values, and performs processes based on the identified commands.

The process may be any process or may be, for example, a process of outputting the character or the sound (voice) of the dialogue text from the speaker 322 using the character or dialogue text of the identified command as a sound signal.

Here, in the example of FIGS. 7 to 9, the CPU 319 identifies one command on the basis of operations on two lever portions (for example, the operation on the lever portion 13 and the operation on the lever portion 14). In this state, the CPU 319 may perform a process based on the command by confirming the reception of the command in accordance with a state in which another prescribed operation unit (for example, a button) has been pushed.

Although a case where the value that X can take and the value that Y can take are the same is shown in the example of FIGS. 7 to 9, the present disclosure is not limited thereto and the value that X can take, and the value that Y can take may be different.

Although three command tables of XG=0, 1, and 2 are shown in the example of FIGS. 7 to 9, the number of such command tables may be, for example, one, two, or four or more.

Also, the command tables shown in FIGS. 7 to 9 may be editable. The editing of each command table may be performed, for example, by an administrator of the command table (here, a person other than a user of the input device 1) or may be performed by the user.

Here, a case where the number of divisions N of the range (the third range) allocated to the command with, respect to X and Y is 7 is shown in the command tables shown in FIGS. 7 to 9, but a command table suitable for the changed number of divisions N is provided, for example, when the number of divisions N of one or both, of X and Y is changed.

The command table suitable for the changed number of divisions N may be automatically generated, for example, by the input device 1 or other devices (e.g., a server and the like) or may be manually generated by a user of the input device 1 or the like.

Although the case where the command is associated with dialogue text (a, string) or a character is shown in the present embodiment, information associated with the command is not specifically limited and may be, for example, image information.

When the command associated with the image information is determined (confirmed), the CPU 319 may execute, for example, a process of displaying and outputting an image on a screen.

<Command Table and Command Transitions>

In the input device 1 according to the present embodiment, command transition is possible according to an operation on one lever portion and command table transition is possible.

Although the operation on the lever portion 13 be described as an example for such a transition operation in the present embodiment, a similar transition operation may be applied to other lever portions (for example, the lever portion 14).

In the present embodiment, the transition of the increment changing in one direction (an increment for convenience of description) and the transition of the decrement changing in the opposite direction (a decrement for convenience of description) are described as transition.

Also, an increment direction and a decrement direction may be reversed.

Referring to FIGS. 10 and 11, an example of a command table and command transition is shown.

FIG. 10 is a diagram showing an example of an increment in the command table of the input device 1 according to the embodiment.

FIG. 11 is a diagram showing an example of a decrement in the command table of the input device 1 according to the embodiment.

An example of FIG. 10 will be described.

In FIG. 10, a range of an A/D conversion output value [dec] corresponding to the pushing amount of the operation lever 211 of the lever portion 13 is shown.

In the present embodiment, there are a first range where the A/D conversion output value is 0 to 5, a second range where the A/D conversion output value is 250 to 255, and a third range other than the first and second ranges.

For the third range, a range of 6 to 40, a range of 41 to 75, a range of 76 to 110, a range of 111 to 145, a range of 146 to 180, a range of 181 to 215, and a range of 216 to 250 for A/D conversion output values are allocated to X=1, X=2, X=3, X=4, X=5, X=6, and X=7, respectively.

Also, in FIG. 10, 1 to 21 are shown as the X value.

Here, as shown in the example of FIGS. 7, X=1 to 7 in FIG. 10 is a value corresponding to 1 to 7 in, the command table of XG=0.

Also, as shown in the example of FIGS. 8, X=8 to 14 in FIG. 10 is a value corresponding to 1(8) to 7(14) in the command table of XG=1. That is, X=8 to 14 in FIG. 10 corresponds to X=1 to 7 from the A/D conversion output value corresponding to the pushing amount of the operation lever 211, but a value of 8 to 14 is used to distinguish from a case other than XG=1.

Also, as shown in the example of FIGS. 9, X=15 to 21 in FIG. 10 is a value corresponding to 1(15) to 7(21) in the command table of XG=2. That is, X=15 to 21 in FIG. 10 corresponds to X=1 to 7 from the A/D conversion output value corresponding to the pushing amount of the operation lever 211, but a value of 15 to 21 is used to distinguish from a case other than XG=2.

In the example of FIG. 10, the first range corresponding to the pushing amount of the operation lever 211 is associated with, a decrement (XG--) instruction.

Also, the second range corresponding to the pushing amount of the operation lever 211 is associated with an increment (XG++) instruction.

Also, the seven X values in the third range corresponding to the pushing amount of the operation lever 211 are associated with seven commands (including a case where the command is not set).

Also, the increment instruction, and the decrement instruction may also be regarded as a type of command.

In FIG. 10, an example of a state of an increment of the X value and a state of an increment of the XG value in the command table is shown.

In the present example, it is assumed that the initial state is XG=0 and the A/D conversion output value corresponding to the pushing amount of the operation lever 211 is 0.

First, when the X value is incremented from 1 to 7 and the A/D conversion, output value is in the second range, the CPU 319 increments the XG value to XG=¹1. Thereby, the command table can be switched from the command table of XG=0 shown in FIG. 7 to the command table of XG=1 shown in FIG. 8.

Subsequently, after the X value is temporarily set to any of the values of 8 to 14, when the A/D conversion output value is in the second range, the CPU 319 increments the XG value and sets XG=2. Thereby, the command table can be switched from the command table of XG=1 shown in FIG. 8 to the command table of XG=2 shown in FIG. 9.

Here, when the A/D conversion output value is in the second range and XG is incremented, the A/D conversion output value remains in the second range, such that the increment (the second range) is valid again after the range temporarily becomes a range other than the second range (the third range in the present embodiment) in the present embodiment.

Also, as another example of the configuration, when the A/D conversion output value remains in the second range continuously for a prescribed period from the time when the A/D conversion output value is in the second range and XG is incremented, the CPU 319 may further perform an increment process.

Thus, in the present example, the allocated value increases from 1 to 7 when the operation lever 211 is pushed in the state of XG=0, XG is incremented by 1 when the allocated value is in the second range, XG=1 and the state thereof is maintained. From, here, when the operation lever 211 is released, it exits from the second range and the allocated value 7 (X=14) in the command table of XG=1 is selected. From here, when the operation lever 211 is pushed again and enters the second range, XG is incremented by 1, XG=2, and the state thereof is, maintained.

Also, in the case of the increment when the maximum XG value (XG=2 in the present example) is reached, for example, a configuration of the transition to the minimum XC value (XG=0 in the present example) may be used.

An example of FIG. 11 will be described.

As in FIG. 10, in FIG. 11, a range of an A/D conversion output value [dec] corresponding to the pushing amount of the operation lever 211 of the lever portion 13 is shown.

As in FIG. 10, in FIGS. 11, 1 to 21 are shown as X values.

Also, as in the example of FIG. 10, the first range and the decrement are associated and the second range and the increment are associated.

In FIG. 11, an example of a state of the decrement of the X value and a state of the decrement of the XG value in the command table is shown.

In the present example, it is assumed that the initial state is XG=2 and 21 is allocated as the A/D conversion output value corresponding to the pushing amount of the operation lever 211.

First, when the X value is decremented from 21 to 15 and the A/D conversion output value is in the first range, the CPU 319 decrements the XG value and sets XG=1. Thereby, the command table can be switched from the command table of XG=2 shown in FIG. 9 to the command table of XG=1 shown in FIG. 8.

Subsequently, after the X value is temporarily set to any of the values of 8 to 14, when the A/D conversion output value is in the first range, the CPU 319 decrements the XG value and sets XG=0. Thereby, the command table can be switched from the command table of XG=1 shown in FIG. 8 to the command table of XG=0 shown in FIG. 7.

Here, when the A/D conversion output value is in the first range and XG is decremented, the A/D conversion output value remains in, the first range, such that the decrement (the first range) is valid again after the range temporarily becomes a range other than the first range (the third range in the present embodiment) in the present embodiment.

Also, as another example of the configuration, when the A/D conversion output value remains in the first range continuously for a prescribed period from the time when the A/D conversion output value is in the first range and XG is decremented, the CPU 319 may further perform a decrement process.

Thus, in the present example, the allocated value decreases from 7 to 1 when the operation lever 211 is released in the state of XG=2, XG is decremented by 1 when the allocated value is in the first range, XG=1, and the state thereof is maintained. From here, when the operation lever 211 is pushed, it exits from the first range and the allocated value 1 (X=8) in the command table of XG=1 is selected. From here, when the operation lever 211 is released again and enters the first range, XG is decremented by 1, XG=0, and the state thereof is maintained.

Also, an instruction for the transition to the maximum XG value (XG=2 in the present example) may be associated with the first range of the minimum XG value (XG 0 in the present example). In this case, if the range is the first range when the minimum. XG value (XG=0 in the present example) is reached, the value transitions to the maximum XG Value (XG=2 in the present example).

For example, a loop process may be performed in the state of the minimum XG value (XG=0 in the present example) and the state of the maximum XG value (XG=2 in the present example).

Here, a case where an increment process is performed continuously is shown in the example of FIG. 10 and a case where a decrement process is performed continuously is shown in the example of FIG. 11, but the increment, decrement and X-value switching may, be performed in any order. That is, in the present example, an increment process is performed in the second range, a decrement process is performed in the first range, and a switching process is performed between seven X values in seven division ranges (sub-ranges) of the third range.

Figure 12:
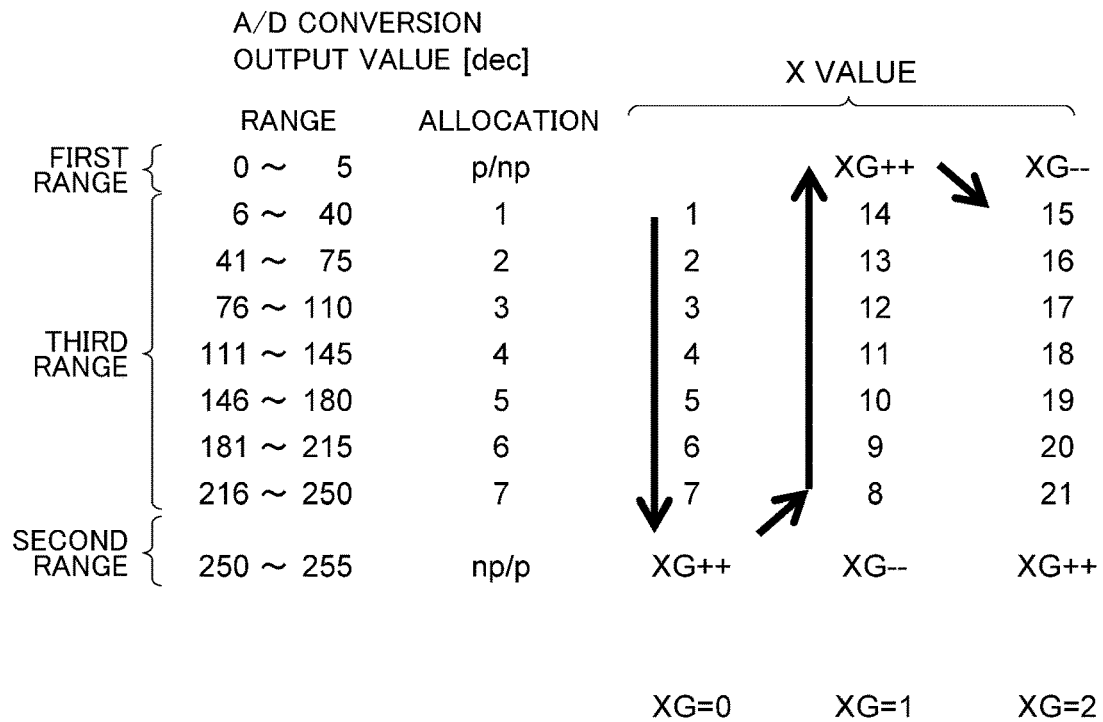
FIG. 12 is a diagram showing another example of the increment in the command table of the input device according to the embodiment.
Figure 13:
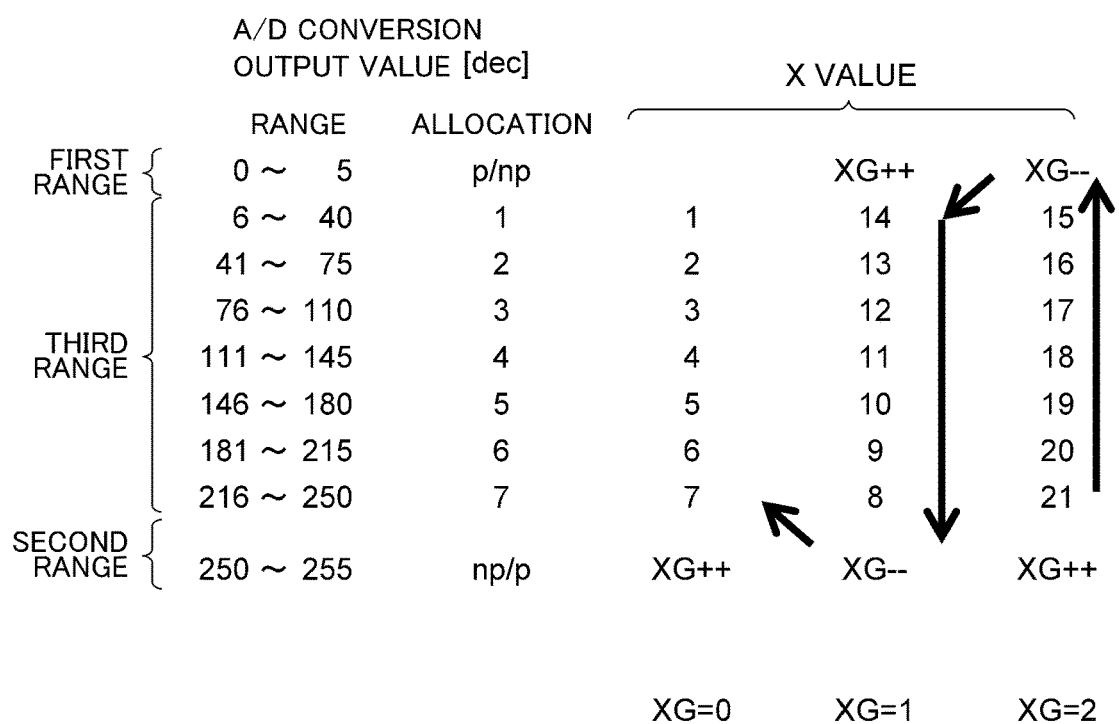
FIG. 13 is a diagram showing another example of the decrement in the command table of the input device according to the embodiment.

Referring to FIGS. 12 and 13, other examples of command tables and command transitions are shown.

FIG. 12 is a diagram showing another example of the increment in the command table of the input device 1 according to the embodiment.

FIG. 13 is a diagram showing another example of the decrement in the command table of the input device 1 according to the embodiment.

An example of FIG. 12 will be described.

In FIG. 12, a range of A/D conversion output values [dec] corresponding to the pushing amount of the operation lever 211 of the lever portion 13 is shown. This is similar to the case of FIG. 10.

Also, in FIG. 12, 1 to 21 are shown as the X value.

Here, when XG is an even number of 0 or more, the association between the X value and the command is similar to that of FIG. 10.

On the other hand, when XG is an odd number of 1 or more (in the case of XG 1 in the example of FIG. 12), the association between the X value and the command is different from that of FIG. 10. Specifically, each command of 14 to 8 shown in FIG. 8 is associated with one of X values of 1 to 7 corresponding to the pushing amount of the operation lever 211. That is, when the notation in the example of FIG. 8 is used, the correspondence of X=1(14), 2(13), 3(12), 4(11), 5(10), 6(9), and 7(8) is made and the order of the seven commands allocated to the X values of 1 to 7 is reversed from the example of FIG. 8.

In the example of FIG. 12, when XG is an even number of 2 or more (when XG=2 in the example of FIG. 12), the first range corresponding to the pushing amount of the operation lever 211 is, associated with a decrement (XG−−) instruction. On the other hand, when XG is an odd number of 1 or more (when XG=1 in the example of FIG. 12), the first range is associated with an increment (XG++) instruction.

Also, when XG is an even number of 0 or more, the second range corresponding to the pushing amount of the operation lever 211 is associated with the increment (XG++) instruction. On the other hand, when XG is an odd number of 1 or more (when XG=1 in the example of FIG. 12), the second range is associated with the decrement (XG−−) instruction.

Also, the values of the seven X values in the third range corresponding to the pushing amount of the operation lever 211 are associated with seven commands (including a case where the command is not set).

Also, the increment instruction and the decrement instruction may also be regarded as a type of command.

In FIG. 12, an example of a state of an increment of the X value and a state of an increment of the XG value in the command table is shown.

In the present example, it is assumed that the initial state is XG=0 and the A/D conversion output value corresponding to the pushing amount of the operation lever 211 is 0.

First, when the X value is incremented from 1 to 7 and the A/D conversion output value is in the second range, the CPU 319 increments the XG value to XG=1. Thereby, the command table can be switched from the command table of XG=0 shown, in FIG. 7 to the command table of XG=1 shown in FIG. 8.

Subsequently, after the X value is moved from 8 to 14, when the A/D conversion output value is in the first range, the CPU 319 increments the XG value to XG=2. Thereby, the command table can be switched from the command table of XG=1 shown in FIG. 8 to the command table of XG=2 shown in FIG. 9.

Thus, in the present example, the allocated value increases from 1 to 7 when the operation lever 211 is pushed the state of XG=0, XG is incremented by 1 when the allocated value is in the second range, and XG=1. From here, when the operation lever 211 is released, the allocated value is in the first range, XG is incremented by 1, and XG=2.

Also, in the case of the increment when the maximum. XG value (XG=2 in the present example) is reached, for example, a configuration of the transition to the minimum XG value (XG=0 in the present example) may be used.

An example of FIG. 13 will be described.

As in FIG. 12, in FIG. 13, a range of an A/D conversion output value [dec] corresponding to the pushing amount of the operation lever 211 of the lever portion 13 is shown.

As in FIG. 12, in FIG. 13, 1 to 21 are shown as X values.

Also, as in the example of FIG. 12, the increment or the decrement is associated with the first range and the second range.

In FIG. 13, an example of a state of the decrement of the X value and a state of the decrement of the XG value in the command table is shown.

In the present example, it is assumed that the initial state is XG=2 and 21 is allocated as the A/D conversion output value corresponding to the pushing amount of the operation lever 211.

First, when the X value is decremented from 21 to 15 and the A/D conversion output value is in the first range, the CPU 319 decrements the XG value and sets XG=1. Thereby, the command table can be switched from the command table of XG=2 shown in FIG. 9 to the command table of XG=1 shown in FIG. 8.

Subsequently, after the X value is moved from 14 to 8, when the A/D conversion output value is in the second range, the CPU 319 decrements the XG value and sets XG=0. Thereby, the command table can be switched from the command table of XG=1 shown in FIG. 8 to the command table of XG=0 shown in FIG. 7.

Thus, in the present example, the allocated value decreases from 21 to 15 when the operation lever 211 is released in the state of XG=2, XG is decremented by 1 when the allocated value is in the first range, and XG=1. From here, when the operation lever 211 is pushed and enters the second range, XG is decremented by 1 and XG=0.

Also, an instruction for the transition to the maximum XG value (XG=2 in the present example) may be associated with the first range of the minimum XG value (XG=0 in the present example). In this case, when the range is the first range when the minimum XG value (XG=0 in the present example) is reached, the value transitions to the maximum XG value (XG=2 in the present example).

For example, a loop process may be performed in the state of the minimum XG value (XG=0 in the present example) and the state of the maximum XG value (XG=2 in the present example).

Here, a case where an increment process is performed continuously is shown in the example of FIG. 12 and a case where a decrement process is performed continuously is shown in the example of FIG. 13, but the increment, decrement and X-value switching may be performed in any order. That is, in the present example, an increment or decrement process is performed in the first range and the second range and a switching process is performed between seven X values in seven division ranges (sub-ranges) of the third range.

Referring to FIG. 14, another example of the command table and command transitions is shown.

FIG. 14 is a diagram showing another example of the increment and decrement of the command table of the input device 1 according to the embodiment.

In the present example, increment and decrement processes for the command table, are performed in accordance with a combination of operations on the two lever portions 13 and 14.

In FIG. 14, a range of an A/B conversion output value [dec] corresponding to the pushing amount of the operation lever 211 of the lever portion 13 is shown.

Also, as in FIG. 12, in FIG. 13, 1 to 21 are shown as X values.

These are similar to those of FIG. 12.

In the present example, when the pushing amount of the operation lever 211 of the lever portion 13 is in the second range (for example, at that moment), the CPU 319 increments or decrements the XG value on the basis of the pushing amount of the operation lever 211 of the other lever portion 14.

In the example of FIG. 14, the pushing amount of the operation lever 211 of the other lever portion 14 is incremented when Y=np and is decremented when Y=p.

Here, Y=np indicates that the pushing amount of the operation lever 211 of the other lever portion 14 is in the first range.

Also, Y=p indicates that the pushing amount of the operation lever 211 of the other lever portion 14 is in the second range.

The association between the pushing amount of the operation lever and the increment or decrement is not limited to the association illustrated in the present embodiment, and other associations may be used.

Also, the present disclosure is not limited to a configuration in which an increment or decrement process is performed according to the pushing amount of the operation lever of one lever portion or a configuration in which an increment or decrement process is performed according to a combination of the pushing amounts of the operation levers of two lever portions. For example, a configuration in which an increment or decrement process is performed according to a combination of the pushing amounts of the operation levers of three or more lever portions may be used.

Also, a configuration in which the increment or decrement process is performed by combining the pushing amounts of the operation levers of one or more lever portions with an operation on another operation unit (for example, a button or the like) may be used.

<Output in Increment or Decrement>

The CPU 319 may perform a prescribed output process, for example, when the XG value for identifying the command table has been incremented. The output process may be, for example, one or more of sound, light, vibration, and display output processes.

The CPU 319 may perform a prescribed output process, for example, when the XG value for identifying the command table has been decremented. The output process may be, for example, one or more of sound, light, vibration, and display output processes.

Here, different output processes may be used for the output process when the XG value is incremented and the output process when the XG value is decremented.

The CPU 319 may perform a prescribed output process, for example, when the X value has been incremented (when the division range (sub-range) is switched). The output process may be, for example, one or more of sound, light, vibration, and display output processes.

The CPU 319 may perform a prescribed output process, for example, when the X value has been decremented (when the division range (sub-range) is switched). The output process may be, for example, one or more of sound, light, vibration, and display output processes.

Here, different output processes may be used as the output process when the X Value has been incremented and the output process when the X value has been decremented.

Also, different output processes may be used as the output process when the X value has been increased (incremented) and the output process when the X value has been decreased (decremental).

<Information Processing System>

Figure 15:
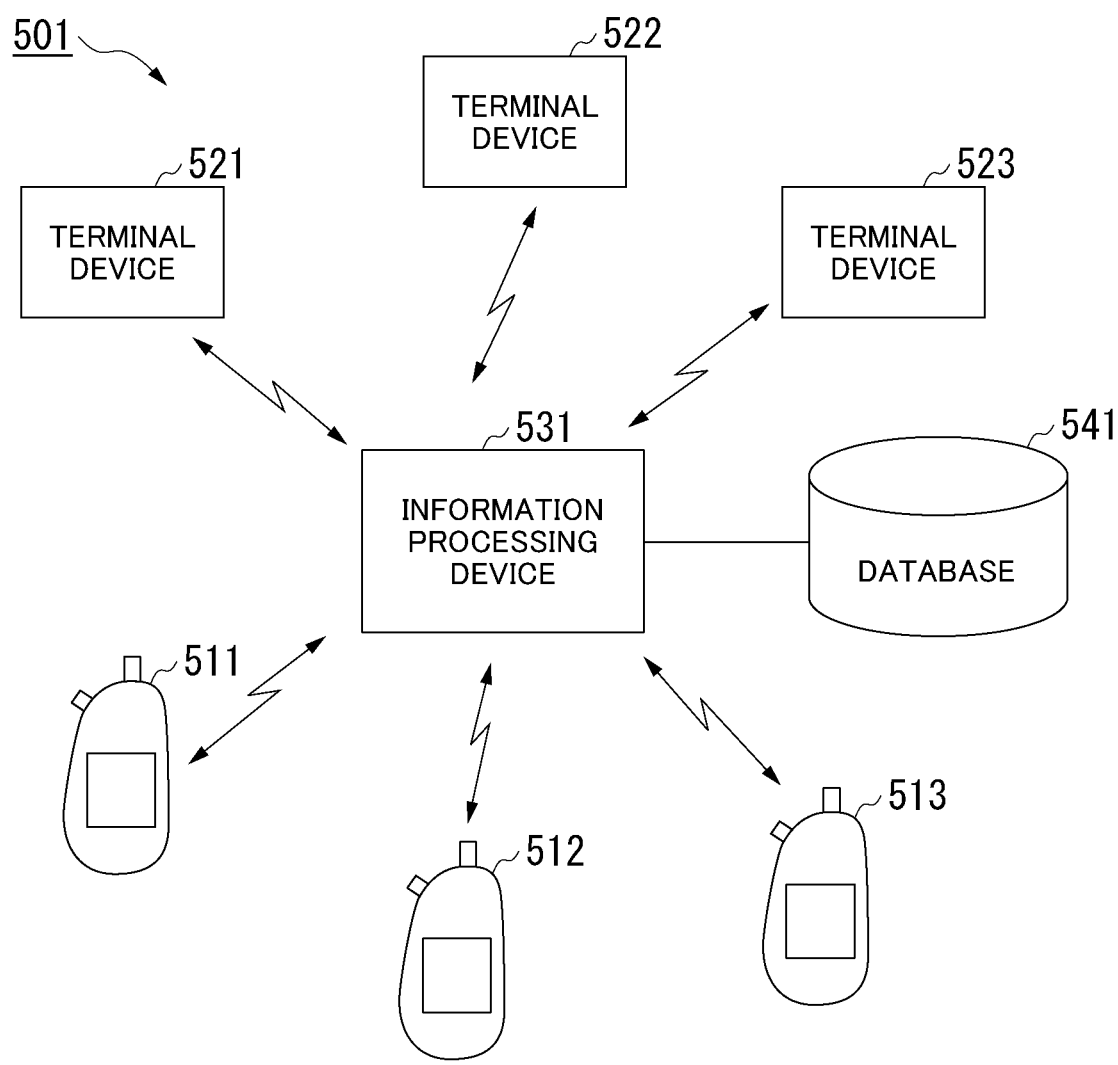
FIG. 15 is a diagram showing an example of a schematic configuration of an information processing system according to an embodiment.

FIG. 15 is a diagram showing an example of a schematic configuration of the information processing system 501 according to the embodiment.

The information processing system 501 includes a plurality of input devices 511 to 513, a plurality of terminal devices 521 to 523, an information processing device 531, and a database 541.

Here, three input devices 511 to 513 are shown as a plurality of input devices in the example of FIG. 15, but the number of input devices may be, for example, two or four or more.

Each of the plurality of input devices 511 to 513 is similar to, for example, the input device 1 according to the present embodiment.

Although three terminal devices 521 to 523 are shown as a plurality of terminal devices in the example of FIG. 15, the number of terminal devices may be, for example, two or four or more.

Each of the terminal devices 521 to 523 may include, for example, a smartphone, a notebook, or a desktop computer.

The information processing device 531 is, for example, a server device configured using a computer.

The database 541 stores command tables for use in the input devices 511 to 513.

Although a case where the information processing device 531 and the database 541 are separate bodies has been shown in the example of FIG. 15, these may be configured to be integrated as another example of the configuration.

Each of the input devices 511 to 513 can acquire information of a command table from the information processing device 531 and the like by communicating with the information processing device 531 via wireless communication (or wired communication).

The information processing device 531 has a function of reading information from a command table stored in the database 541 and providing the read information to the input devices 511 to 513 on the basis of instructions from the input devices 511 to 513.

Thus, the command table may be stored in a device other than the input devices 511 to 513 (the database 541 in the example of FIG. 15).

In the information processing system 501, a common command table can be shared by a plurality of input devices 511 to 513.

Also, for example, each of the input devices 511 to 513 may read and use necessary information from the information stored in the database 541 at a necessary timing or may temporarily acquire (for example, download) and internally store the information of the command table stored in the database 541 and use the internally stored information of the command table.

Also, one or more of the input devices 511 to 513 and the terminal device 521 to 523 can read the information of the command table and the like stored in the database 541 via the information processing device 531 and edit the read information. This editing process may be performed using a prescribed application in each of the input devices 511 to 513 or each of the terminal devices 521 to 523.

The information processing device 531 can read the information of the command table and the like stored in the database 541 and save edited information in the database 541 on the basis of instructions from the input devices 511 to 513 or the terminal devices 521 to 523.

For example, any device of the input devices 511 to 513 or the terminal devices 521 to 523 can rewrite the information of the command table stored in the database 541 and the like and other devices can use the rewritten information.

Thus, information such as a command table shared by a plurality of input devices 511 to 513 can be rewritten in common by a plurality of devices (for example, the input devices 511 to 513 or the terminal devices 521 to 523).

Here, each of the terminal devices 521 to 523 may be operated, for example by a user of any one of the input devices 511 to 513 or by a person other than users of the input devices 511 to 513.

As described above, the input device 1 according to the present embodiment can facilitate operations for inputting commands such as a large number of characters.

In the present embodiment, a smart input device (the input device 1) having an operation lever that can be operated sensuously and having the improved usability of the operation lever can be implemented.

In the input device 1, an oval-shaped housing that can be gripped with one hand, operation levers of a plurality of lever portions, and a decision function of deciding on commands such as characters (a function of the CPU 319 in the present embodiment) are provided.

For example, the two or more lever portions are provided at positions corresponding to the two or more fingers of the user's hand gripping the housing on the outer surface of the housing. Each operation lever may take a plurality of operating positions.

In the decision function, the command is decided on when the user operates a plurality of operation levers and performs a prescribed operation (a prescribed gesture).

The decision function selects a command on the basis of, for example, a change in the operation positions (the operation position history) of a plurality of operation levers. Also, the decision function decides on (confirms) the command when a prescribed operation (for example, a button pushing operation or the like) for confirmation is performed by the user in a state in which one command has been selected.

Therefore, in the input device 1, the user can select a command such as a character or a response message, for example, without removing the finger from the operation lever and without viewing the screen, in accordance with the operation amounts of the plurality of operation levers with one hand, such that a quick response is possible.

Also, because the input device 1 can quickly select a command on the basis of a change in the operation positions (the operation position history) of a plurality of operation levers, many commands can be quickly selected.

In the input device 1, a processing step of identifying a command group by changing an operation position of one operation lever of the plurality of lever portions and a processing step of deciding on one command as an input command according to a change in the operation position of another operation lever of the plurality of lever portions among a plurality of commands included in the identified command group are executed.

Therefore, in the input device 1, the user can switch a command group, for example, according to an operation on one operation lever for use in selecting a command, such that many commands can be quickly designated, for example, with simple finger movement. In this configuration in which a command group can be switched by the operation on one operation lever, the command group can be switched even without the operation on another operation portion (for example, a switch or the like) or the convenience of use for the user can be improved.

Also, as another example of the configuration, a configuration in which a command group is switched by a combination of operations on a plurality of operation levers may be used.

The input device 1 has a prescribed range (a first range) near the operation position when the user's finger has been removed from the operation lever with respect to the operation lever and has a prescribed range (a second range) near the operation position when the user's finger has pushed the operation lever completely. Also, in the input device 1, when the operation position of the operation lever reaches each range, a specific operation corresponding to each range (for example, switching a command group) is performed.

Therefore, in the input device 1, when it is determined (detected) that the operation position of the operation lever has become a prescribed range (the first range or the second range), the command group can be switched and a large number of commands can be input at a high speed by the user.

For example, the command table is used in the input device 1, such that a large number of commands can be selected with a small number of finger operations and a configuration in which input operations can be performed without using a little finger or a ring finger that is difficult to move can be adopted. Also, as another example of the configuration, a configuration in which the little finger or ring finger is used for the input operation may be used.

In the input device 1, the decision function may provide a prescribed output (notification) to the operator (the user) as feedback every time a command is selected or decided on (confirmed).

In the input device 1, the decision function may provide feedback of a prescribed output (notification) to the operator (the user) every time the command group is switched.

Therefore, in the input device 1, whenever one or more of events such as command selection, command decision (confirmation) and command group switching occur, a new feedback notification is started and therefore the user can ascertain the state of the operation position of the operation lever and a quick input process is possible.

In the input device 1, for example, when a command is selected or decided on (confirmed), the output of a unique output pattern allocated to the command may be started.

Also, in the input device 1, for example, when the command group is switched, the output of a unique output pattern allocated to the command group may be started.

As the output of the unique output pattern, for example, one or more of vibration in a unique vibration pattern, blinking light in a prescribed blinking pattern, and turning on light in a prescribed emission color pattern may be used.

Therefore, in the input device 1, whenever the command selected or decided on (confirmed) by the operation position of the operation lever changes, feedback of the unique pattern allocated to the command is immediately started and therefore the user can easily ascertain the command and the fast operation can be enabled.

Also, in the input device 1, whenever the command group changes in accordance with the operation position of the operation lever, feedback of the unique pattern allocated to the command group is immediately started and therefore the user can easily ascertain the command group and the fast operation can be enabled.

For example, the user can perform high-speed input operations and high-precision input operations by memorizing patterns (feedback patterns) in which unique patterns change when commands are continuously switched.

In the input device 1, a vibrating element or a light-emitting element may be mounted in each operation lever. Thereby, when a specific operation is performed by the operation of the operation lever, it is possible to perform a cooperative operation in two or more output modes of the vibrating elements and the light-emitting elements.

For example, the input device 1 performs feedback in a pattern of vibrations or light every time a selection operation is usually performed for each operation lever, but a cooperative operation may be performed in a plurality of output modes when a specific operation is performed at the time of input confirmation or the like.

Therefore, in the input device 1, for example, the operator (the user) can identify the transition to a state different, from a state in which input characters are selected and the operation breaks can be easily recognized by the user and the fast input can be enabled.

The input device 1 includes an utterance element (for example, a speaker) inside of the housing and utters dialogue text, characters, or the like corresponding to the input command.

Therefore, in the input device 1, for example, dialogue text, characters, or the like corresponding to the input command are immediately uttered by voice and therefore content that the user wants to convey can be immediately conveyed by voice.

In the input device 1, a display screen is provided in the housing and the content of the selected command (for example, dialogue text, characters, or the like) is displayed in the center of the screen or the like.

Therefore, in the input device 1, because the content of the command selected by the operation on the plurality of operation levers is always displayed in the center of the screen or the like, for example, a process of displaying a cursor on the screen can be unnecessary and the content of the command can be easily viewed by the user.

In the input device 1, a voice input function (for example, a microphone function) of inputting the voice uttered by the other party speaker and converting the voice into a voice signal, a voice recognition function (a function of the CPU 319 in the present embodiment) of converting the voice signal into text data in a voice recognition process, and a display screen are provided. Also, the input device 1 converts the voice uttered by the other party speaker into text data and displays text of the text data on the screen.

Therefore, in the input device 1, because the content of speech uttered by the other speaker is displayed as text, the user can understand the content of the other speaker's speech with text, and, for example, two-way communication can be performed quickly and reliably.

In the input device 1, a lever portion having an operation lever includes one or more magnets, one or more magnetic sensors, and a repulsive material (for example, a plastic spring). Also, in the input device 1, the operation lever is pushed with one finger of the user and the operation lever is slid on one axis and therefore the operation position of the operation lever is acquired.

Therefore, in the input device 1, for example, by employing a piston-shaped operation lever that is repelled with a spring, the user can perform a simple and accurate operation with one finger.

Also, in the present embodiment, for example, using a plurality of command groups, it is possible to increase the number of commands allocated to the operation of one finger of the user to a large number.

The information processing system 501 according to the present embodiment includes a storage unit (for example, a database) that stores a command table including a plurality of commands and an information processing device (for example, a server device or the like) capable of rewriting information about the command table, the content of each command, or the like.

Also, the input device 1 (the input devices 511 to 513 in the example of FIG. 15) or the terminal device can establish a communication connection, for example, with the information processing device, and issue an instruction for rewriting the information about the stored command table, the content of each command, or the like.

Therefore, in the information processing system 501, the content of the command table can be arbitrarily rewritten by the user or the like, for example, the content or arrangement of dialogue text according to the user's preference can be implemented and various responses can be performed at a high speed.

In the information processing system 501 according to the present embodiment, the information processing device (for example, a server device) can save a command table or the like in an external storage unit (for example, a database) or read a command table or the like from the external storage unit (for example, the database).

Also, the terminal device (for example, a computer) can read a command table or the like via an information processing device and edit data such as the read command table.

Also, the terminal device (for example, the computer) can store (save) a command table or the like in a storage unit via the information processing device.

Thus, in the information processing system 501, for example, a plurality of terminal devices can form a community via the information processing device.

As a specific example, in the information processing system 501, by reading the content of the command table edited by another person (another user) or the content of the individual command, it is possible to obtain and use the content and arrangement of convenient dialogue text or the like that he or she (the user) did not notice and easily improve operability.

In the input device 1 according to the present embodiment, for example, it is possible to support a natural language dialogue between a deaf person and a healthy person.

In input device 1, a plurality of fingers of a user (e.g., a deaf person) can perform an operation of selecting a desired command from a plurality of commands (a dialogue, characters, or the like). In the input device 1, for example, a user (for example, a deaf person) can be supported by performing an audio output process, a display output process, or the like for dialogue text corresponding to the selected command.

Also, for example, a microphone is provided in the input device 1 and therefore it is possible to display and output the content of speech, of a healthy person on a screen.

Thus, the input device 1 is also suitable for daily use by a deaf person and it is possible to perform an assistance process so that the speed and accuracy of the input operation by the deaf person is increased.

As a specific example, in the input device 1, dialogue text input by a user (for example, a deaf person) or the like is immediately uttered by voice and therefore the user can immediately convey the matters the user wants to convey by voice.

Also, in the input device 1, by instantly converting the speech of a healthy person into text information and displaying the text information, for example, even if the user is deaf and unable to read the mouth, the user can understand the speech of the healthy person as text and quick two-way communication can be implemented.

[Example of Configuration]

As, an example of configuration, the input device (the input device 1 in the example of FIG. 1) includes an operation unit of which an operation amount is variable (the operation lever 211 of the lever portion 13 or the lever portion 14 in examples of FIGS. 1, 4A and 4B and the like), and a control unit (the CPU 319 in the example of FIG. 6). The control unit selects one command group (for example, the XG value) among a plurality of command groups and decides on a command on the basis of the command group selected and the operation amount of the operation unit. Also, when the operation amount of the operation unit is in a prescribed range (for example, the first range and the second range in the present embodiment), the control unit switches the command group selected (for example, the XG value).

As an example of one configuration, in the input device, the prescribed range includes a first range and a second range.

When the operation amount of the operation unit is in the first range, the control unit switches the command group selected by shifting (changing) the selected command group in a first direction (for example, a direction in which the XG value decreases or increases).

When the operation amount of the operation unit is in the second range, the control unit switches the command group selected by shifting (changing) the selected command group in a second direction opposite to the first direction (for example, a direction in which the XG value increases or decreases).

Also, for example, a combination of the first direction and the second direction may be common to all command tables (e.g., all XG values) or may differ according to each command table selected (e.g., an XG value).

As, an example of one configuration, in the input device the first range is a range of a prescribed range from the minimum value of the operation amount of the operation unit (a range of 0 to 0+a in the present embodiment) and the second range is a range of a prescribed range from the maximum value of the operation amount of the operation unit (a range of 255−b to 255 in the present embodiment).

A range excluding the first range and the second range from the prescribed range is defined as a third range. The third range is divided into a plurality of sub-ranges. Each of a plurality of commands is allocated to an each of the plurality of the sub-ranges Also, a and b may be set to any values in any method.

As another example of the configuration a mode of a=0, b=0, or a=b=0 may be used.

As an example of the configuration, the input device includes a second operation unit (the operation unit and the second operation unit correspond to the two lever portions 13 and 14 in the present embodiment).

The control unit decides on the command on the basis of the operation amount of the operation unit and an operation amount of the second operation unit.

As an example of the configuration, in the input device, the control unit performs a prescribed output process in one or more of command group switching, command selection, and command decision (confirmation).

As an example of the configuration, in the input device, the prescribed output process is an output process of an output mode unique to each command.

As an example of the configuration, in the input device, the control unit performs an output process in which a plurality of output modes are combined as the prescribed output process when a specific operation is performed.

As an example of the configuration, in the input device, the control unit makes utterances based on information corresponding to the decided command.

As an example of the configuration, in the input device, the control unit performs a display process based on information corresponding to the decided command.

As an example of the configuration, in the input device, the operation unit includes an operation lever (the operation lever 211 configured to slide in the example of FIGS. 4A and 4B) configured to slide or rotate with respect to one axis and a magnetic sensor (the magnetic sensor 253 in the example of FIGS. 4A and 4B) configured to, obtain an output value corresponding to movement of the operation lever.

The control unit determines the operation amount on the basis of the output value from the magnetic sensor.

Also, a program for implementing the function of any component of any device described above may be recorded on a computer-readable recording medium and the program may be read and executed by a computer system. Also, the "computer system" used here may include an operating system (OS) or hardware such as peripheral devices. Also, the "computer-readable recording medium" refers to a flexible disc, a magneto-optical disc, a read-only memory (ROM), a portable medium such as a compact disc-ROM (CD-ROM), or a storage device such as a hard disk embedded in the computer system. Furthermore, the "computer-readable recording medium" is assumed to include a medium that holds a program for a constant period of time, such as a volatile memory inside a computer system serving as a server or a client when the program is transmitted via a network such as the Internet or a communication circuit such as a telephone circuit. For example, the volatile memory may be a random-access memory (RAM). For example, the recording medium may be a non-transitory recording medium.

Also, the above-described program may be transmitted from a computer system storing the program in a storage device or the like to another computer system via a transmission medium or by transmission waves in a transmission medium. Here, the "transmission medium" for transmitting the program refers to a medium having a function of transmitting information, as in a network such as the Internet or a communication circuit such as a telephone circuit.

Also, the above-described program may be a program for implementing some of the above-described functions. Also, the above-described program may be a so-called differential file capable of implementing the above-described function in combination with a program already recorded on the computer system. The differential file may be referred to as a differential program.

Also, the function of any component of any device described above may be implemented by a processor. For example, each process in the embodiment may be implemented by a processor that operates on the basis of information of a program or the like and a computer-readable recording medium that stores information of a program or the like. Here, in the processor, for example, the function of each part may be implemented by individual hardware or the function of each part may be implemented by integrated hardware. For example, the processor may include hardware and the hardware may include at least one of a circuit that processes a digital signal and a circuit that processes an analog signal. For example, the processor may be configured using one or more circuit devices or/and one or more circuit elements mounted on a circuit board. An integrated circuit (IC) or the like may be used as the circuit device and a resistor, a capacitor, or the like may be used as the circuit element.

Here, the processor may be, for example, a CPU. However, the processor is not limited to the CPU and, for example, various types of processors such as a graphics processing unit (GPU) or a digital signal processor (DSP) may be used. Also, for example, the processor may be a hardware circuit based on an application specific integrated circuit (ASIC). Also, the processor may include, for example, a plurality of CPUs, or may include a hardware circuit of a plurality of ASICs. Also, the processor may include, for example, a combination of a plurality of CPUs and a hardware circuit including a plurality of ASICs. Also, the processor may include, for example, one or more of an amplifier circuit and a filter circuit for processing an analog signal and the like.

Although embodiments of the present disclosure have been described in detail above with reference to the drawings, specific configurations are not limited to the embodiments and other designs and the like may also be included without departing from the scope of the present disclosure.

<Configuration 1>
An input device comprising:
an operation unit of which an operation amount is variable; and
a control unit,
wherein the control unit is configured to select one command group among a plurality of command groups and decides on a command on a basis of the command group selected and the operation amount of the operation unit, and
wherein the control unit switches the command group selected when the operation amount of the operation unit is in a prescribed range.

<Configuration 2>
The input device according to configuration 1>,
wherein the prescribed range includes a first range and a second range,
wherein, when the operation amount of the operation unit is in the first range, the control unit switches the command group selected by shifting the selected command group in a first direction, and
wherein, when the operation amount of the operation unit is in the second range, the control unit switches the command group selected by shifting the selected command group in a second direction opposite to the first direction.

<Configuration 3>
The input device according to <configuration 2>,
wherein the first range is a range of a prescribed range from a minimum value of the operation amount of the operation unit,
wherein the second range is a range of a prescribed range from a maximum value of the operation amount of the operation unit, and
wherein a range excluding the first range and the second range from the prescribed range is defined as a third range, the third range is divided into a plurality of sub-ranges and each of a plurality of commands is allocated to an each of the plurality of the sub-ranges.

<Configuration 4>
The input device according to any one of <configuration 1> to <configuration 3>, comprising a second operation unit,
wherein the control unit decides on the command on the basis of the operation amount of the operation unit and an operation amount of the second operation unit.

<Configuration 5>
The input device according, to any one of <configuration 1> to <configuration 4>, wherein the control unit performs a prescribed output process in one or more of command group switching, command selection, and command decision.

<Configuration 6>
The input device according to <configuration 5>, wherein the prescribed output process is an output process of an output mode unique to each command.

<Configuration 7>
The input device according to <configuration 5> or <configuration 6>, wherein the control unit performs an output process in which a plurality of output modes are combined as the prescribed output process when a specific operation is performed.

<Configuration 8>
The input device according to any one of <configuration 1> to <configuration 7>, wherein the control unit makes utterances based on information corresponding to the decided command.

<Configuration 9>
The input device according to any one of <configuration 1> to <configuration 8>, wherein the control unit performs a display process based on information corresponding to the decided command.

<Configuration 10>
The input device according to any one of <configuration 1> to <configuration 9>,
wherein the operation unit includes an operation lever configured to slide or rotate with respect to one axis and a magnetic sensor configured to obtain an output value corresponding to movement of the operation lever, and
wherein the control unit determines the operation amount on the basis of the output value from the magnetic sensor.

DESCRIPTION OF REFERENCES 1, 511 to 513 Input device
11 Housing
12 Screen
13, 14 Lever portion
15 Speaker
111 Hand
201 Lever portion
211 Operation lever
212 Plastic spring portion
213 Housing
221 Magnetic sensor attachment portion
222 Magnetic sensor substrate attachment slit
251, 252 Magnet
253, 311 312 Magnetic sensor
313 A/D converter
314 Display
315 LED
316 Radio module
317 Sound output unit 318 Vibration unit
319 CPU
321 Speech amplifier
322 Speaker
331 Vibration amplifier
332 Vibrating element
351 Battery
501 Information processing system
521 to 523 Terminal device
531 Information processing device
541 Database
2011 Special characteristic
A1 Center line
B1 Initial state line

What is claimed is:

1. An input device comprising:
a first operation unit of which a first operation amount is variable, the first operation unit including a first operation lever, and the first operation amount corresponding to a pushing amount of the first operation lever;
a second operation unit of which a second operation amount is variable, the second operation unit including a second operation lever, and the second operation amount corresponding to a pushing amount of the second operation lever; and
a control unit, wherein
the first and second operation units are configured to be disposed at a plurality of different operation positions according to the respective first and second operation amounts,
the control unit is configured to select a command group among a plurality of command groups and determine a command on a basis of the selected command group, the first operation amount of the first operation unit and the second operation amount of the second operation unit, and
the control unit switches the selected command group when the first operation amount of the first operation unit or the second operation amount of the second operation unit is in a prescribed range.

2. The input device according to claim 1,
wherein the prescribed range includes a first range and a second range,
wherein, when the first operation amount of the first operation unit or the second operation amount of the second operation unit is in the first range, the control unit switches the selected command group by shifting the selected command group in a first direction, and
wherein, when the first operation amount of the first operation unit or the second operation amount of the second operation unit is in the second range, the control unit switches the selected command group by shifting the selected command group in a second direction opposite to the first direction.

3. The input device according to claim 2,
wherein the first range is a range of a prescribed range from a minimum value of the first operation amount of the first operation unit or the second operation amount of the second operation unit,
wherein the second range is a range of a prescribed range from a maximum value of the first operation amount of the first operation unit or the second operation amount of the second operation unit, and
wherein a range excluding the first range and the second range from the prescribed range is defined as a third range, the third range being divided into a plurality of sub-ranges, and each of a plurality of commands being allocated to an each of the plurality of the sub-ranges.

4. The input device according to claim 1, wherein the control unit performs a prescribed output process in one or more of command group switching, command selection, and command determining.

5. The input device according to claim 4, wherein the prescribed output process is an output process of an output mode unique to each command.

6. The input device according to claim 4, wherein the control unit performs an output process in which a plurality of output modes are combined as the prescribed output process when a specific operation is performed.

7. The input device according to claim 1, wherein the control unit makes utterances based on information corresponding to the determined command.

8. The input device according to claim 1, wherein the control unit performs a display process based on information corresponding to the determined command.

9. The input device according to claim 1,
wherein the first operation lever is configured to slide with respect to one axis and the first operation unit includes a magnetic sensor configured to obtain an output value corresponding to movement of the first operation lever, and
wherein the control unit determines the first operation amount of the first operation unit on the basis of the output value from the magnetic sensor.

* * * * *